United States Patent
Kamal et al.

(10) Patent No.: US 9,013,235 B2
(45) Date of Patent: Apr. 21, 2015

(54) MONOLITHIC THREE DIMENSIONAL (3D) FLIP-FLOPS WITH MINIMAL CLOCK SKEW AND RELATED SYSTEMS AND METHODS

(71) Applicant: QUALCOMM Incorporated, San Diego, CA (US)

(72) Inventors: Pratyush Kamal, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/012,445

(22) Filed: Aug. 28, 2013

(65) Prior Publication Data

US 2015/0022250 A1    Jan. 22, 2015

Related U.S. Application Data

(60) Provisional application No. 61/846,652, filed on Jul. 16, 2013.

(51) Int. Cl.
*H01L 25/00* (2006.01)
*H03K 3/037* (2006.01)
*G06F 17/50* (2006.01)

(52) U.S. Cl.
CPC .......... *H03K 3/0372* (2013.01); *G06F 17/5068* (2013.01)

(58) Field of Classification Search
USPC .................................. 327/202, 203, 564, 565
See application file for complete search history.

(56) References Cited

U.S. PATENT DOCUMENTS

| 4,999,528 | A | 3/1991 | Keech |
| 5,164,612 | A | 11/1992 | Kaplinsky |
| 5,821,791 | A | 10/1998 | Gaibotti et al. |
| 6,333,656 | B1 | 12/2001 | Schober |
| 7,650,549 | B2 | 1/2010 | Branch et al. |
| 8,242,826 | B2 * | 8/2012 | Chi et al. .................. 327/203 |
| 8,497,732 | B2 * | 7/2013 | Yasuda et al. ............. 327/565 |
| 2010/0001774 | A1 | 1/2010 | Djaja et al. |
| 2014/0146630 | A1 * | 5/2014 | Xie et al. .................. 365/226 |

OTHER PUBLICATIONS

Alam, Syed M. et al., "3D IC Integration with Selected Circuit Elements in Separate Strata for Power Management and Reduced Design Complexity," IP.com, Jul. 28, 2006, Ip.com, Inc., 6 pages.
Groger, M. et al., "High Speed I/O and Thermal Effect Characterization of 3D Stacked ICs," 2009 IEEE International Conference on 3D System Integration (3DIC 2009), Sep. 28-30, 2009, San Francisco, CA, IEEE, 5 pages.

(Continued)

*Primary Examiner* — Hai L Nguyen
(74) *Attorney, Agent, or Firm* — Withrow & Terranova, PLLC

(57) ABSTRACT

Monolithic three dimensional (3D) flip-flops with minimal clock skew and related systems and methods are disclosed. The present disclosure provides a 3D integrated circuit (IC) (3DIC) that has a flop spread across at least two tiers of the 3DIC. The flop is split across tiers with transistor partitioning in such a way that keeps all the clock related devices at the same tier, thus potentially giving better setup, hold and clock-to-q margin. In particular, a first tier of the 3DIC has the master latch, slave latch, and clock circuit. A second tier has the input circuit and the output circuit.

20 Claims, 7 Drawing Sheets

(56) References Cited

OTHER PUBLICATIONS

Wu, T. et al., "The Fabrication of Poly-Si MOSFETs using Ultra-Thin High-K/Metal-Gate Stack for Monolithic 3D Integrated Circuits Technology Applications," 2011 International Semiconductor Device Research Symposium (ISDRS), Dec. 7-9, 2011, College Park, MD, IEEE, 2 pages.

International Search Report and Written Opinion for PCT/US2014/046688, mailed Oct. 21, 2014, 11 pages.

* cited by examiner

MONOLITHIC THREE DIMENSIONAL (3D) FLIP-FLOPS WITH MINIMAL CLOCK SKEW AND RELATED SYSTEMS AND METHODS

PRIORITY APPLICATION

The present application claims priority to U.S. Provisional Patent Application Ser. No. 61/846,652 filed on Jul. 16, 2013 and entitled "MONOLITHIC THREE DIMENSIONAL (3D) SCAN D-FLOP DESIGN WITH MINIMAL CLOCK SKEW" which is incorporated herein by reference in its entirety.

BACKGROUND

I. Field of the Disclosure

The technology of the disclosure relates generally to monolithic three dimensional (3D) integrated circuits (IC) (3DIC).

II. Background

Mobile communication devices have become common in current society. The prevalence of these mobile devices is driven in part by the many functions that are now enabled on such devices. Demand for such functions increases processing capability requirements and generates a need for more powerful batteries. Within the limited space of the housing of the mobile communication device, batteries compete with the processing circuitry. The limited space contributes pressure to a continued miniaturization of components and power consumption within the circuitry. While miniaturization has been of particular concern in the integrated circuits (ICs) of mobile communication devices, efforts at miniaturization of ICs in other devices have also proceeded.

Historically, elements within an IC have all been placed in a single two dimensional active layer with elements interconnected through one or more metal layers that are also within the IC. Efforts to miniaturize are reaching their limits in a two dimensional space and thus, design thoughts have moved to three dimensions. While there have been efforts to connect two or more ICs through a separate set of metal layers outside the IC proper, that solution is not properly a three dimensional (3D) approach. Likewise, two IC chips have been stacked one atop another with connections made between the two IC chips through solder bumps (i.e., the so called "flip chip" format). Likewise, there are system in package (SIP) solutions that stack IC chips atop one another with connections made between the chips with through silicon vias (TSVs). While arguably the flip chip and TSV embodiments represent 3D solutions, the amount of space required to effectuate a flip chip remains large. Likewise, the space required to implement a TSV relative to the overall size of the chip becomes space prohibitive.

In response to the difficulties in effectuating small ICs that meet miniaturization goals, the industry has introduced monolithic three dimensional ICs (3DICs). The advent of monolithic 3DIC has provided a number of interesting possibilities in circuit design, but creates its own design issues. In particular, process variations between layers or tiers of the 3DIC may result in unacceptable clock skew with very large 3-sigma spread. When such skewed clock signals are applied to flip-flops, this clock skew may result in unacceptable setup times, hold times, or clock-to-q margins. The skew introduced by the process variations may further be aggravated by the software that automatically performs chip layout design.

SUMMARY OF THE DISCLOSURE

Embodiments disclosed in the detailed description include monolithic three dimensional (3D) flip-flops with minimal clock skew and related systems and methods. The present disclosure provides a 3D integrated circuit (IC) (3DIC) that has a flop spread across at least two tiers of the 3DIC. The flop is split across tiers with transistor partitioning in such a way that keeps all the clock related devices at the same tier, thus potentially giving better setup, hold and clock-to-q margin. In particular, a first tier of the 3DIC has the master latch, slave latch, and clock circuit. A second tier has the input circuit and the output circuit. By placing the elements of the flop requiring a minimal sampling window in a single tier, each of these elements are subject to the same manufacturing process, and thus, process variations between elements in the same tier are minimized. While process variations between tiers may still exist, the process variations for each of the clock related devices are reduced. By reducing or eliminating the process variations between the clock related elements, the clock skew to each element is consistent and able to be addressed readily.

In this regard in one embodiment, a 3D flip-flop is provided. The 3D flip-flop comprises a master latch disposed in a first tier of a 3DIC, the master latch configured to receive an input and a clock input, the master latch configured to provide a master latch output. The 3D flip-flop also comprises a slave latch disposed in the first tier of the 3DIC, the slave latch configured to provide a 3DIC flip-flop output. The 3D flip-flop further comprises a clock circuit configured to provide the clock input, the clock circuit disposed in the first tier of the 3DIC. The 3D flip-flop also comprises a data input circuit configured to provide the data input to the master latch, the data input circuit disposed in a second tier of the 3DIC different from the first tier.

In this regard in one embodiment, a 3D flip-flop is provided. The 3D flip-flop includes a master means for receiving an input and a clock input, the master means configured to provide a master latch output, the master means disposed in a first tier of a 3DIC. The 3D flip-flop also includes a slave means for providing a 3DIC flip-flop output, the slave means disposed in the first tier of the 3DIC. The 3D flip flop also includes a clock means for providing the clock input, the clock means disposed in the first tier of the 3DIC. The 3D flip-flop also includes a data input circuit configured to provide data input to the master means, the data input circuit disposed in a second tier of the 3DIC different from the first tier.

In this regard, in a further embodiment, a method of designing a flip-flop is disclosed. The method includes disposing a master latch, a slave latch, and a clock circuit in a first tier of a 3DIC. The method also includes disposing a data input circuit in a second tier of the 3DIC different from the first tier.

DETAILED DESCRIPTION

Figure 1:
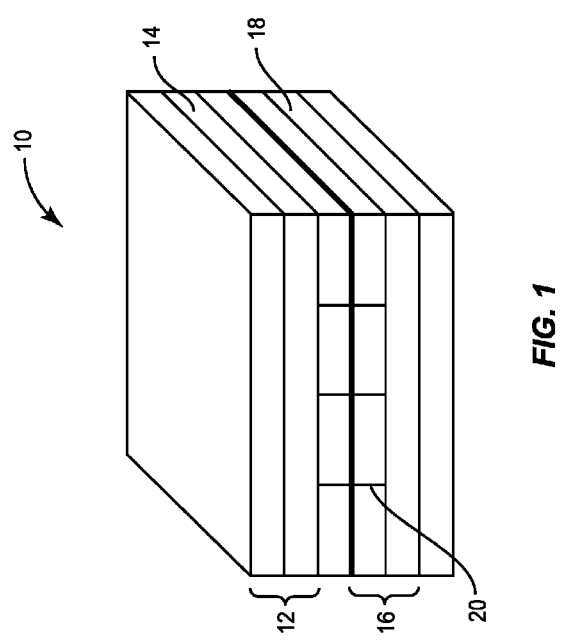
FIG. 1 is a perspective view of an exemplary three dimensional (3D) integrated circuit (IC) (3DIC)

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include monolithic three dimensional (3D) flip-flops with minimal clock skew and related systems and methods. The present disclosure provides a 3D integrated circuit (IC) (3DIC) that has a flop spread across at least two tiers of the 3DIC. The flop is split across tiers with transistor partitioning in such a way that keeps all the clock related devices at the same tier, thus potentially giving better setup, hold and clock-to-q margin. In particular, a first tier of the 3DIC has the master latch, slave latch, and clock circuit. A second tier has the input circuit and the output circuit. By placing the elements of the flop requiring a minimal sampling window in a single tier, each of these elements are subject to the same manufacturing process, and thus, process variations between elements in the same tier are minimized. While process variations between tiers may still exist, the process variations for each of the clock related devices are reduced. By reducing or eliminating the process variations between the clock related elements, the clock skew to each element is consistent and able to be addressed readily.

In this regard, FIG. 1 is a perspective view of an exemplary 3DIC 10 that may incorporate flops according to the present disclosure. The 3DIC 10 has a first tier 12 with a first active layer 14 in which elements are disposed. The 3DIC 10 has a second tier 16 different than the first tier 12 with a second active layer 18 in which elements are disposed. The elements within the first active layer 14 and the second active layer 18 are interconnected by monolithic intertier vias (MIV) 20. For more information about MIV, the interested reader is referred to "High-Density Integration of Functional Modules Using Monolithic 3D-IC Technology" by Shreepad Panth et al. in the proceedings of the IEEE/ACM Asia South Pacific Design Automation Conference, 2013; pp. 681-686 which is hereby incorporated by reference in its entirety. The 3DIC 10 may be formed through hydrogen cutting or similar technique. For more information on an exemplary hydrogen cutting process, the interested reader is referred to U.S. patent application Ser. No. 13/765,080, filed Feb. 12, 2013, which is herein incorporated by reference in its entirety. The tiers 12, 16 may be electrically isolated (other than the MIV 20) by an electromagnetic shield (not shown) such as a graphene shield. For more information about graphene shields in 3DIC, the interested reader is referred to U.S. patent application Ser. No. 13/765,061, filed Feb. 12, 2013, the disclosure of which is herein incorporated by reference in its entirety.

Figure 2:
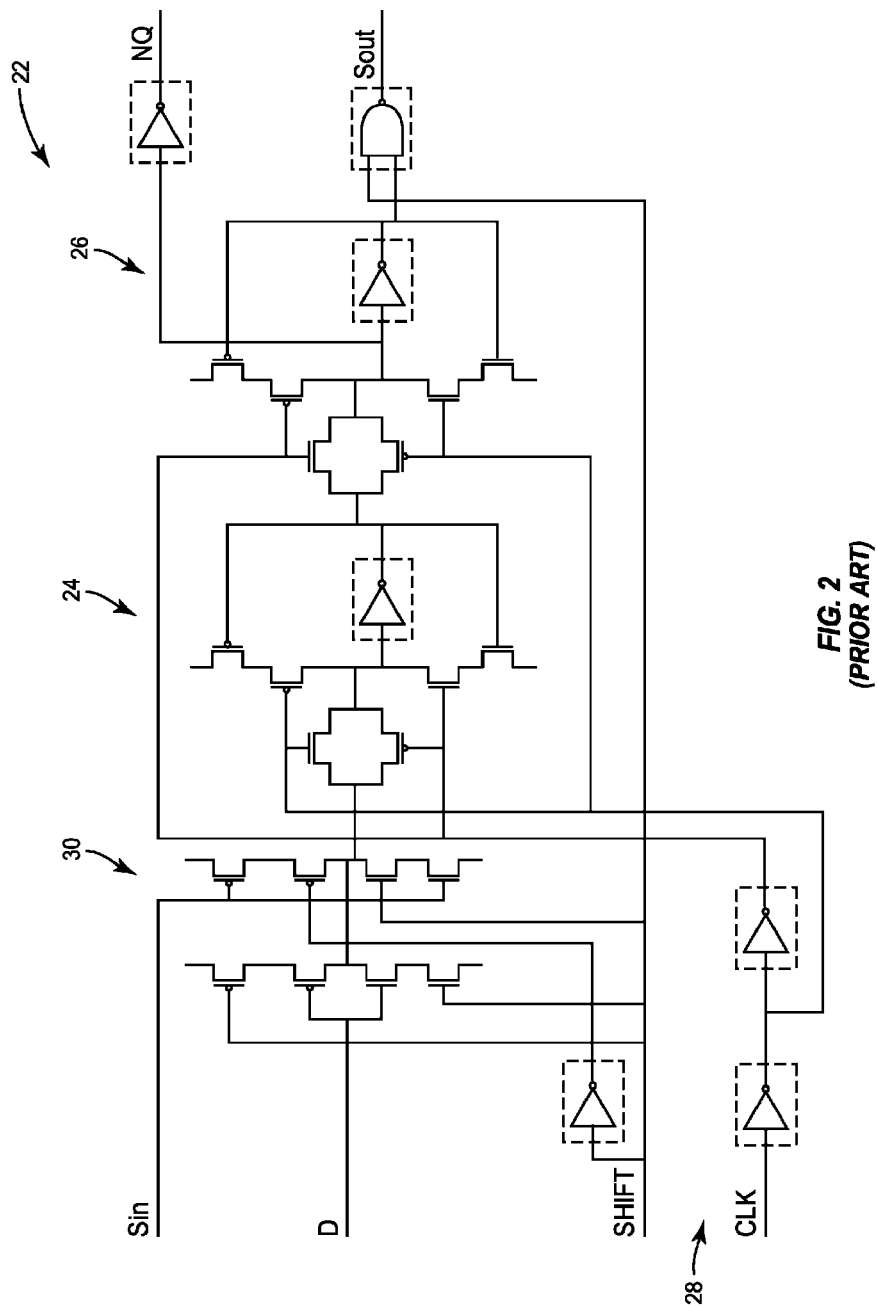
FIG. 2 is a block diagram of an exemplary conventional scan D-flop circuit.

With reference to FIG. 2, an exemplary conventional scan D-flop 22 is illustrated. For clarification of terminology, a D-flop is a form of a flip-flop. Likewise, a scan flop is a type of flip-flop that allows testing of the flip-flop through some additional circuitry. Because such testing is ubiquitous, many conventional flip-flops are in reality scan flip-flops. In conventional deployments, each element of the D-flop 22 is positioned within a single active layer of an IC (not shown) with interconnections between elements of the D-flop 22 achieved in the metal layers (not shown) of the IC as is well understood. The D-flop 22 includes a master latch 24 and a slave latch 26. The D-flop 22 also includes a clock circuit 28 and a data input circuit 30. While the master latch 24, slave latch 26, clock circuit 28, and data input circuit 30 each include one or more transistors or other elements, these are not explicitly labeled since such elements are conventional and well known in the industry. For more information about flip-flops and D-flops in general, the interested reader is directed to U.S. Pat. No. 2,850,566, filed Sep. 8, 1953, which is hereby incorporated by reference in its entirety. As noted above, in the conventional D-flop 22, each of the master latch 24, slave latch 26, clock circuit 28 and data input circuit 30 are all within one plane of the IC.

Problems arise with conventional flip-flops as the number of devices in a particular IC grows. As the number of devices grows, the delay between elements may result in unacceptable clock-to-q skew. The sources of clock skew are a result of local device to device mismatches, which can be due to random or systematic variation (or both). A random variation may be the result of a difference in dopant concentration within the channel of the device which results in the device being slightly slower or faster compared to the target. Similarly, due to shrinking geometries, the local context within the die, or smaller section therein, that a particular device sits in also leads to differences in dopant concentration (due to non-regular absorption of activation energy) as well as differences in the lattice stress that eh channel undergoes, again resulting in a device that is slower or faster than the target. Another source of variation is the non-singular interconnect delays between different devices as not all interconnects (or the metals to connect device terminals) are the same. One technique that has been proposed by the assignee of the present disclosure is to use monolithic 3DIC to shorten the length of connective conductors. While shortening connective conductors does reduce delay, process variations between tiers of a monolithic 3DIC may result in unintentional skew and a large 3-sigma spread.

The present disclosure addresses the process variations across tiers by implementing a flip-flop across multiple tiers of a 3DIC. However, the flip-flop is arranged so that the master and slave latches are on the same tier with the clock circuitry. The input circuitry is on a second, different tier. By placing the master and slave latches on the same tier with the clock circuitry, the process variations are uniform within that tier which reduces the skew and the 3-sigma spread.

Figure 3:
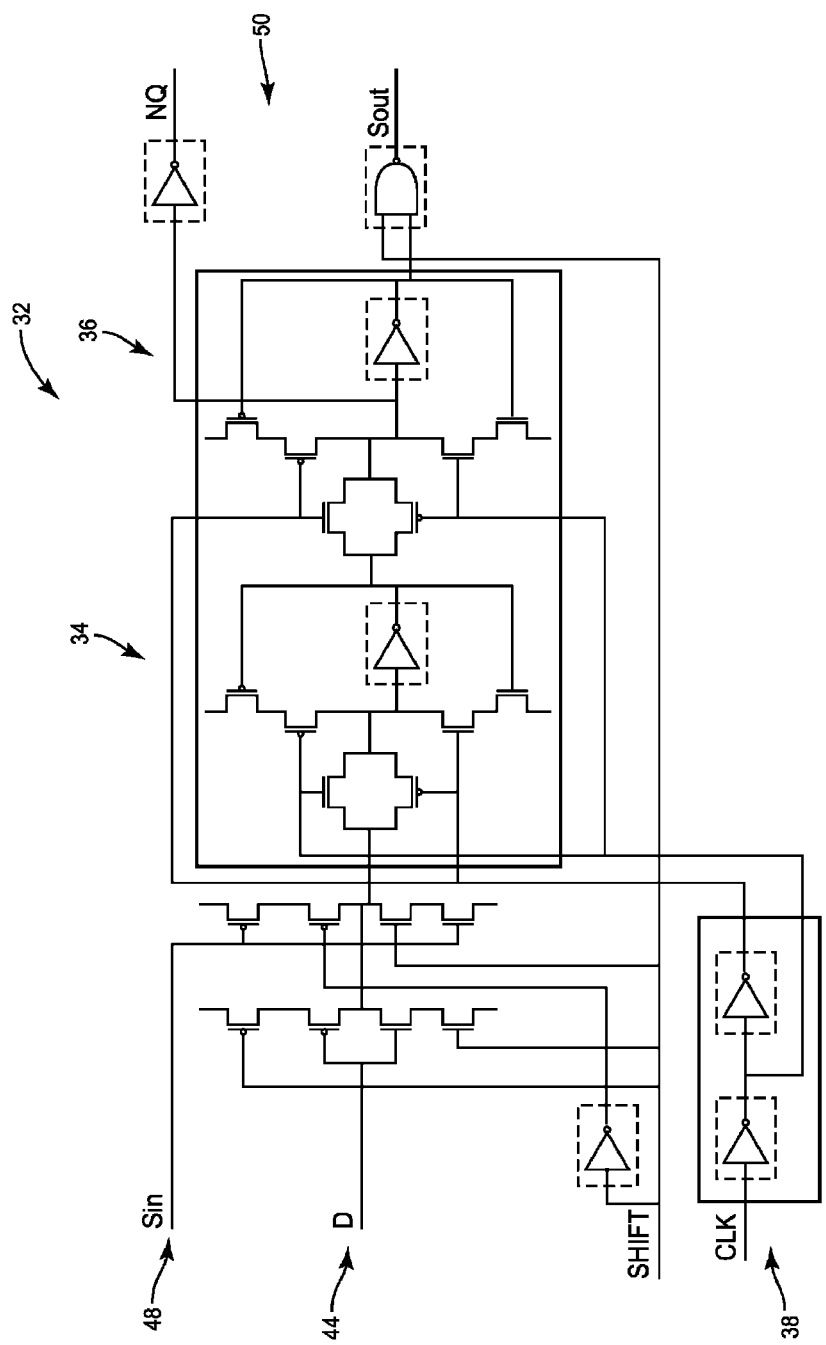
FIG. 3 is a block diagram highlighting exemplary concepts of the present disclosure within a scan D-flop circuit.
Figure 4:
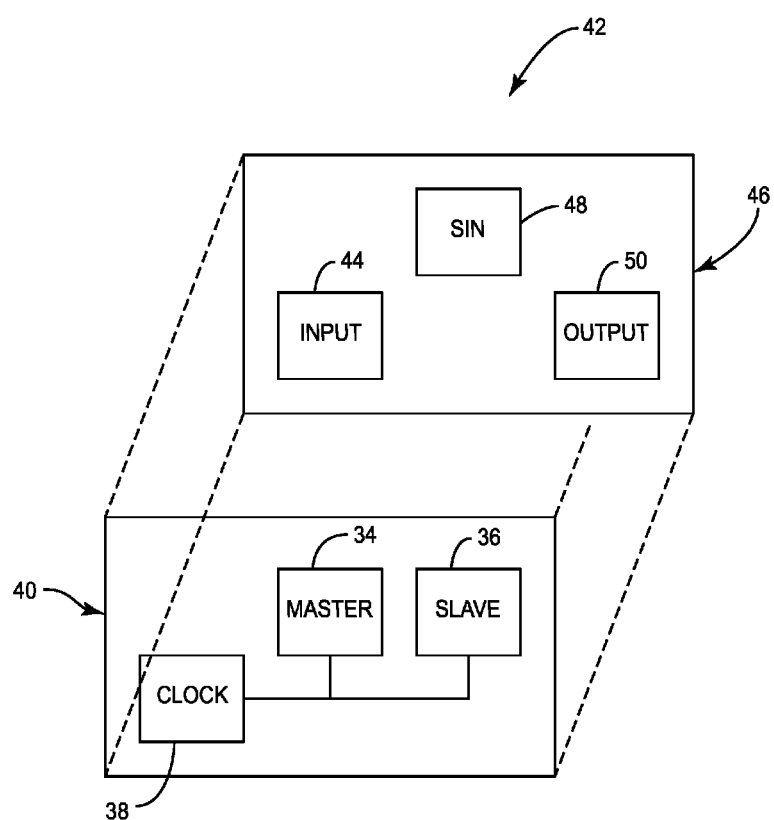
FIG. 4 is a simplified exploded perspective view of a 3DIC incorporating the exemplary D-flop of FIG. 3.

In this regard, FIGS. 3 and 4 illustrate a schematic of a flip-flop 32 having a master latch 34, a slave latch 36 and clock circuitry 38 disposed in a first tier 40 (FIG. 4) of a 3DIC 42 (FIG. 4). Data input circuit 44 is disposed in a second tier 46 (FIG. 4) of the 3DIC 42. Note that the flip-flop 32 may be a scan flop and have a scan input (Sin) 48, although the concepts of the present disclosure work well for both scan flops and normal flip-flops. If the flip-flop 32 is a scan flop, then in addition to the scan input 48, an input multiplexer (not shown) may be used to select between the data input circuit 44 and the scan input 48. The multiplexer is positioned in the second tier of the 3DIC. Additionally an output 50 may be positioned on the second tier. In an exemplary embodiment, the first tier 40 is positioned beneath the second tier 46. It should be appreciated that while not illustrated in FIG. 3 or 4, MIV, such as MIV 20 intercouple the first tier 40 with the second tier 46 allowing electrical connections between the elements in the first tier 40 (e.g., the master latch 34, slave latch 36, and clock circuitry 38) and the elements in the second tier 46 (e.g., data input 44, scan input 48, and output 50).

In exemplary embodiments, the materials or characteristics of the tiers may be varied to further improve or optimize performance. For example, the first tier may have transistors having a lower threshold voltage than the transistors of the second tier. Alternatively, the transistors of the first tier may be made from high-K metal gate transistors and the transistors of the second tier may be made from polysilicon transistors.

Figure 5:
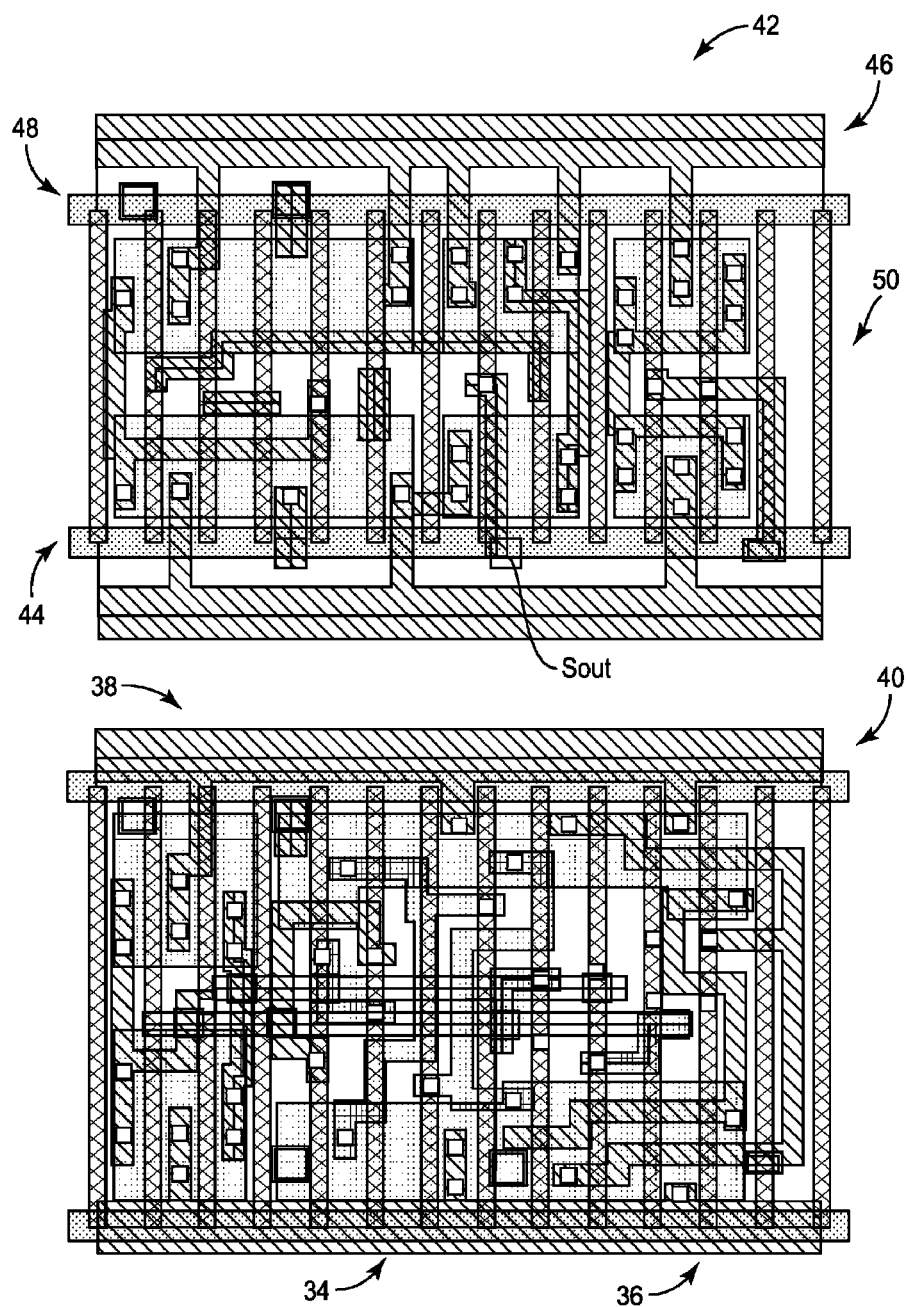
FIG. 5 is an exemplary 3DIC incorporating a scan D-flop according to an exemplary embodiment of the present disclosure.

FIG. 5 illustrates an exemplary die layout for the flip-flop 32 in the 3DIC 42. In particular, FIG. 5 shows the various conductive and semiconductive elements in a top plan view format as laid out by circuit design software and tested through a program such as Simulation Program with Integrated Circuit Emphasis (SPICE). As with the circuit shown in FIGS. 3 and 4, the first tier 40 includes the master latch 34, the slave latch 36, and the clock circuitry 38. The second tier 46 includes the data input 44, the scan input 48, and the output 50.

Using the monolithic 3DIC with the folded flip-flop 32 of the present disclosure provides improved power/performance/area (PPA) trade-off for most Application Specific Integrated Circuit (ASIC) designs and eliminates or at least reduces mismatches or unintended skew due to random process variations between different tiers of the 3DIC. This arrangement should result in minimal clock skew and give a flop with a good setup, hold and clock-to-q margins. An additional benefit is that by moving the latches to a different tier, congestion on the input tier is reduced giving enhanced pin accessibility and porosity to the router.

While not illustrated in FIGS. 3 through 5, it should be appreciated that the monolithic 3DIC 42 may include other circuitry such as memory bitcells, digital signal processors, baseband processors, or the like as needed or desired. Such additional elements may complicate circuit layout. Accordingly, many circuits are designed through the use of a software program that automates the placement and interconnection of elements within a circuit. Such software may allow circuit designers to determine where certain elements may be positioned before running the algorithms that assign placements to the remaining elements. Alternatively, the software may accommodate hard macro commands that allow certain sub-elements to have a particular relative arrangement within the circuit regardless of position. One such hard macro command could be the requirement that the master latch 34, slave latch 36 and clock circuit 38 are all in one tier and the inputs 44, 48, and output 50 are in a second tier.

Figure 6:
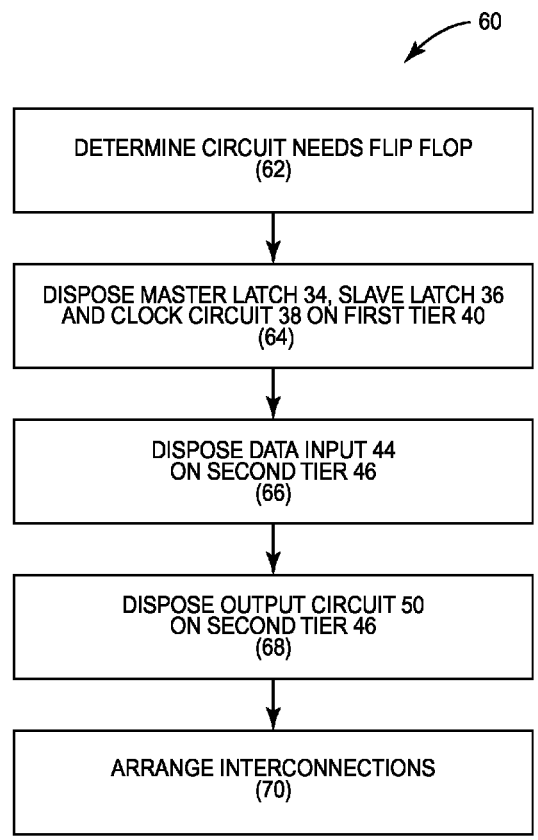
FIG. 6 is a flow chart illustrating a design process that may be used in designing flops according to exemplary embodiments of the present disclosure.

In this regard, FIG. 6 illustrates an exemplary process 60 of circuit design for the flip-flop 32. The process 60 starts when the circuit designer realizes that a flip-flop is needed in the circuit (block 62). The circuit designer, either directly or through the software, disposes the master latch 34, the slave latch 36, and the clock circuit 38 on the first tier 40 (block 64). The circuit designer, either directly or through the software, disposes the data input 44 on the second tier 46 (block 66).

With continued reference to FIG. 6, the circuit designer, either directly or through the software, disposes the output 50 in the second tier 46 (block 68). The circuit designer then arranges the interconnections using MIV 20 or other conductive elements to couple the elements (block 70). The rest of the circuit may then be populated.

The monolithic 3D scan D-flop design with minimal clock skew according to embodiments disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 7:
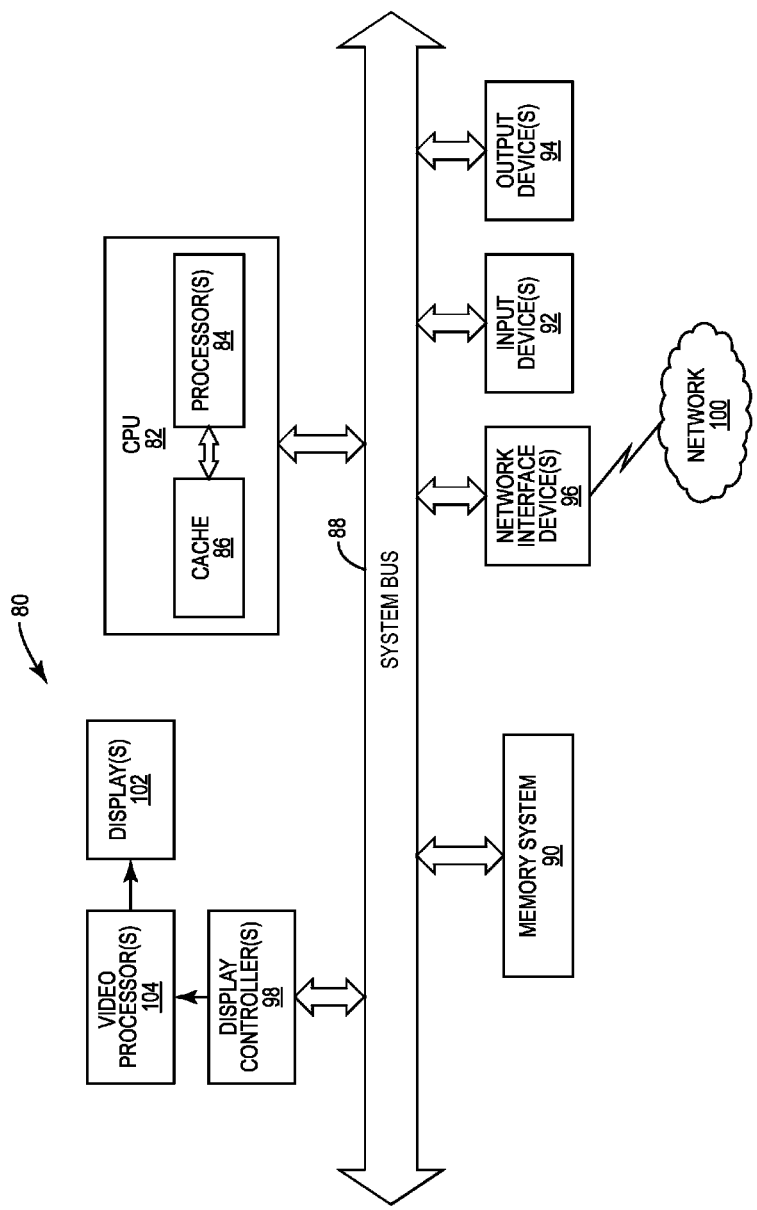
FIG. 7 is a block diagram of an exemplary processor-based system that can include the scan D-flop of FIGS. 3 through 5.

In this regard, FIG. 7 illustrates an example of a processor-based system 80 that can employ the flip-flop 32 illustrated in FIGS. 3 through 5. In this example, the processor-based system 80 includes one or more central processing units (CPUs) 82, each including one or more processors 84. The CPU(s) 82 may have cache memory 86 coupled to the processor(s) 84 for rapid access to temporarily stored data. The CPU(s) 82 is coupled to a system bus 88 and can intercouple devices included in the processor-based system 80. As is well known, the CPU(s) 82 communicates with these other devices by exchanging address, control, and data information over the system bus 88.

Other devices can be connected to the system bus 88. As illustrated in FIG. 7, these devices can include a memory system 90, one or more input devices 92, one or more output devices 94, one or more network interface devices 96 and one or more display controllers 98, as examples. The input device(s) 92 can include any type of input device, including but not limited to input keys, switches, voice processors, etc. The output device(s) 94 can include any type of output device, including but not limited to audio, video, other visual indicators, etc. The network interface device(s) 96 can be any devices configured to allow exchange of data to and from a network 100. The network 100 can be any type of network, including but not limited to a wired or wireless network, private or public network, a local area network (LAN), a wide local area network (WLAN), and the Internet. The network interface device(s) 96 can be configured to support any type of communication protocol desired.

The CPU(s) 82 may also be configured to access the display controller(s) 98 over the system bus 88 to control information sent to one or more displays 102. The display controller(s) 98 sends information to the display(s) 102 to be displayed via one or more video processors 104, which process the information to be displayed into a format suitable for the display(s) 102. The display(s) 102 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an ASIC, a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A three dimensional (3D) flip-flop, comprising:
    a master latch disposed in a first tier of a 3D integrated circuit (IC) (3DIC), the master latch configured to receive an input and a clock input, the master latch configured to provide a master latch output;
    a slave latch disposed in the first tier of the 3DIC, the slave latch configured to provide a 3DIC flip-flop output;
    a clock circuit configured to provide the clock input, the clock circuit disposed in the first tier of the 3DIC; and
    a data input circuit configured to provide data input to the master latch, the data input circuit disposed in a second tier of the 3DIC different from the first tier.

2. The 3D flip-flop of claim 1, further comprising an output circuit configured to receive the master latch output and generate a buffered output of the master latch output, the output circuit disposed in a tier different from the first tier.

3. The 3D flip-flop of claim 2, wherein the tier different from the first tier is comprised of the second tier.

4. The 3D flip-flop of claim 1, wherein the 3DIC is comprised of a monolithic 3DIC.

5. The 3D flip-flop of claim 1, wherein the slave latch comprises a plurality of slave latches and the master latch comprises only a single master latch.

6. The 3D flip-flop of claim 1, wherein the master latch comprises a plurality of master latches and the slave latch comprises only a single slave latch.

7. The 3D flip-flop of claim 1, wherein the clock circuit comprises two inverters to provide a buffered clock signal and a complementary clock signal.

8. The 3D flip-flop of claim 1, further comprising an input multiplexer configured to select between the data input circuit and a scan input provided as the input to the master latch, the input multiplexer disposed in the second tier.

9. The 3D flip-flop of claim 1, wherein the first tier comprises lower threshold voltage transistors relative to transistors in the second tier.

10. The 3D flip-flop of claim 1, wherein the first tier comprises high-K metal gate transistors, and the second tier comprises polysilicon transistors.

11. The 3D flip-flop of claim 1 integrated into an IC.

12. The 3D flip-flop of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

13. A three dimensional (3D) flip-flop, comprising:
    a master means for receiving an input and a clock input, the master means configured to provide a master latch output, the master means disposed in a first tier of a 3D integrated circuit (IC) (3DIC);
    a slave means for providing a 3DIC flip-flop output, the slave means disposed in the first tier of the 3DIC;
    a clock means for providing the clock input, the clock means disposed in the first tier of the 3DIC; and
    a data input circuit configured to provide data input to the master means, the data input circuit disposed in a second tier of the 3DIC different from the first tier.

14. The 3D flip-flop of claim 13, wherein the clock means comprises a clock circuit.

15. The 3D flip-flop of claim 13, wherein the master means comprises a master latch.

16. A method of designing a flip-flop, comprising:
    disposing a master latch, a slave latch, and a clock circuit in a first tier of a three dimensional (3D) integrated circuit (IC) (3DIC); and
    disposing a data input circuit in a second tier of the 3DIC different from the first tier.

17. The method of claim 16, wherein disposing the data input circuit in the second tier comprises configuring the data input circuit to provide data input to the master latch.

18. The method of claim 16, wherein disposing the clock circuit in the first tier comprises configuring the clock circuit to provide a clock input to the master latch.

19. The method of claim 16, wherein disposing the slave latch in the first tier comprises configuring the slave latch to provide a 3DIC flip-flop output.

20. The method of claim 16, further comprising disposing an output circuit in the second tier.

* * * * *